(12) United States Patent
Rylov et al.

(10) Patent No.: US 7,365,663 B2
(45) Date of Patent: Apr. 29, 2008

(54) FLUX-QUANTIZING SUPERCONDUCTING ANALOG TO DIGITAL CONVERTER (ADC)

(75) Inventors: Sergey Rylov, White Plains, NY (US); Amol Inamdar, Elmsford, NY (US)

(73) Assignee: Hypres, Inc., Elmsford, NY (US)

( * ) Notice: Subject to any disclaimer, the term of this patent is extended or adjusted under 35 U.S.C. 154(b) by 0 days.

(21) Appl. No.: 11/509,497

(22) Filed: Aug. 24, 2006

(65) Prior Publication Data
US 2008/0048902 A1  Feb. 28, 2008

(51) Int. Cl.
*H03M 1/00* (2006.01)
(52) U.S. Cl. .................... 341/133; 341/155
(58) Field of Classification Search ......... 341/130–170
See application file for complete search history.

(56) References Cited

U.S. PATENT DOCUMENTS 5,936,458 A * 8/1999 Rylov .................... 327/528
6,509,853 B2 * 1/2003 Gupta .................... 341/133
6,653,962 B2 * 11/2003 Gupta et al. ............. 341/133
6,756,925 B1 * 6/2004 Leung et al. ............. 341/133

* cited by examiner

*Primary Examiner*—Lam T. Mai
(74) *Attorney, Agent, or Firm*—Henry I. Schanzer, Esq

(57) ABSTRACT

A superconducting analog-to-digital converter includes a superconducting input loop to which is applied an analog voltage to be converted to a digital format. The superconducting loop includes two Josephson junctions for converting said analog input voltage into a single flux quantum (SFQ) pulse stream having a frequency f1 which is directly proportional to the amplitude of the analog input voltage. The loop includes two outputs for distributing the pulse stream in a cyclical and staggered fashion onto the two loop outputs such that the frequency of the pulses along each one of the loop outputs is f1/2. Additional frequency divider circuits may be coupled to the loop outputs to produce pulse streams on N output lines having a frequency of f1/N.

25 Claims, 12 Drawing Sheets

SPL: Splitter
CB : Confluence Buffer

FLUX-QUANTIZING SUPERCONDUCTING ANALOG TO DIGITAL CONVERTER (ADC)

BACKGROUND TO THE INVENTION

This invention relates to superconducting integrated circuits and, in particular, to high speed superconducting analog-to-digital converters (ADCs).

Important measures of the performance of an ADC include speed, i.e., the sampling rate in samples converted per second, resolution or sensitivity as measured by the smallest change that can be measured in an analog signal and dynamic range. Ultrafast superconducting digital circuits may be fabricated using Josephson junctions (JJs) integrated together according to RSFQ (rapid-single-flux-quantum) Logic. Furthermore, JJs are well suited to form a natural high-resolution ADC, since a voltage V applied across a JJ (with appropriate damping) generates a rapid sequence of single-flux-quantum (SFQ) digital pulses at a rate determined by fundamental constants defined by f=2 eV/h, where: f is frequency, V is the voltage applied across the JJ, "e" is the charge on an electron, and "h" is Planck's constant. Conversely, a pulse stream applied to a JJ may be used to generate a voltage defined by V=fh/2e.

Using JJs to form ADCs results in an approach which is quite different than that used in conventional semiconductor ADCs. A superconducting ADC may include a Josephson-junction modulator (ADC front-end) followed by an RSFQ digital filter to generate additional digital bits to increase the dynamic range of the ADC. The entire circuit may be constructed using Josephson junction integrated-circuit fabrication technology. This leads to superior performance (effective numbers of bits of dynamic range) with relatively simple circuit architecture.

The present state of the art and problems associated therewith may be illustrated with reference to the simplified prior art analog-to-digital converter (ADC) circuit shown in FIGS. 1 and 1A. An analog input signal is applied to a single junction quantizer 31 to which is also applied an SFQ pulse stream of frequency fc/2. This SFQ pulse stream applied to the quantizer functions to generate (either directly or indirectly) a steady state bias voltage value (corresponding to fc/2). Where the quantizer is designed to operate at a maximum frequency of fc, and the quantizer is to be operated symmetrically about the steady state bias, the value of the bias voltage (VB) is dictated by system considerations to be equal to a voltage corresponding to fc/2. The analog input to the single junction quantizer is the sum (combination) of the bias and the analog input and is designed to vary between zero and two times the bias voltage (i.e., the dynamic range extends in terms of voltage between zero and 2VB and in term of frequency between zero and fc). That is, in response to the analog voltage at its input (which can be proportional either to the ADC input signal or to its time derivative), the single junction quantizer 31 produces a frequency modulated output whose maximum rate is equal to fc. The phase modulated output of the quantizer 31 is fed to a phase demodulator 33 (and a digital decimation filter 35) which needs to be operated at a frequency equal to fc to enable synchronous operation for proper processing of the ADC signals.

As is evident from FIG. 1A, the single junction quantizer circuit provides a single output pulse train whose rate (frequency) is a direct function of the analog input voltage applied to the JJ of the quantizer; that is, f=2 eV/h, as noted above. For this circuit configuration, the components of the quantizer circuit, and in particular the JJ, JJQ, must switch at the (highest) rate (fc) corresponding to the highest value of analog input voltage to be converted by the quantizer circuit. This imposes significant constraints on the maximum speed of response at which the circuit can provide a linear response.

In the circuit of FIG. 1A, the system is designed such that the maximum rate of the pulses at the output of the quantizer is fc. This is done to ensure proper processing of the output pulses generated by the ADC when they are applied to what is referred to as the synchronizing circuitry (31, 35) which is operated at a rate of fc. To have the output of the quantizer 31 operate at a maximum rate of fc when the analog input signal is at its specified maximum level, the quantizer has to be biased at fc/2, or at a corresponding voltage VB, which causes the output of the quantizer to be fc/2, when the analog input signal is zero (neither positive nor negative). The dynamic range is thus limited by the requirement that the bias level be a voltage level which corresponds to fc/2 (with the maximum specified input signal being a voltage corresponding to fc). There thus exits a limitation on the dynamic range of the input signal which can be processed linearly by the single junction quantizer.

The problems discussed above pertaining to switching speed and dynamic range are overcome in circuits embodying the invention.

SUMMARY OF THE INVENTION

An ADC embodying the invention includes a superconducting input loop which functions to convert an analog voltage into digital signals and at the same time also functions as a frequency divider with respect to the digital signals. The digital signals are pulses whose rate is a (linear) function of the amplitude of the analog voltage.

The input loop may include an input node adapted to receive an analog input signal, a first branch including a first Josephson junction (JJ) connected between the input node and a first output, a second branch including a second JJ connected between the input node and a second output, and a flux bias current generating network connected between the first and second outputs to form a closed superconducting loop for supplying a reversible loop current to the JJs of the loop. The values of the components of the loop (i.e., any inductance in series with the first and second JJs, the first and second JJs and the flux bias current) are selected such that, when an analog signal is applied to the input node, output SFQ pulses are alternatively produced at the first and second outputs. The rate of the SFQ pulses produced within the loop, which may be defined as f1, is a (linear) function of the amplitude of the analog signal applied at the input node, while the rate of the pulses at each output is one half that rate (i.e., f½) and the rate at which the first and second JJs switch is also one half that rate (i.e., f½).

Consequently for a given voltage amplitude at the input node which would tend to cause a JJ to switch at a frequency of f1, the components in the first and second branch only have to switch at a frequency of f½ with the alternating output signals at the first and second outputs having a frequency of f½. This enables either higher frequency operation or a more relaxed design of the components within the loop.

To operate the ADC input loop within a desired (frequency) operating range, an ADC circuit embodying the invention includes a bias voltage (offset or pedestal) generating circuit for generating a bias voltage and for applying it to the input node so it adds to the analog input signal at the input node. The bias voltage is made to have at least a sufficient value to ensure that a bipolar analog input signal varying above and below zero volts, within a specified range, when superimposed on the bias voltage, does not cause the voltage at the input node to go below zero or above a predetermined level.

A bias voltage generating circuit embodying the invention may include a high frequency superconducting clock and a flux pump which includes one or more phase generators including confluence buffers for generating a bias voltage which can, in turn, cause the generation of pulse signals which have a higher frequency than the high frequency superconducting clock signal. In one embodiment, the outputs of the flux pump are supplied to an inductive merging circuit for generating a bias voltage (also referred to as an offset or pedestal), which adds to the bipolar analog input signal, generating a combined analog signal which is unipolar. Since this voltage offset is generated from the clock signal, it can be accurately subtracted off digitally at a later time.

In selected embodiments, each of the outputs of the divide-by-two input loop may be applied to additional divide by two networks to produce output pulses on different output lines whose rates are further divided down. The combination of the input loop and the divide by two networks function as a multi-rate quantizer in which an analog input signal added to a bias voltage applied at the input node produces a corresponding SFQ pulse stream whose frequency is divided down by the number of dividing stages of the quantizer.

A multi-rate (e.g., $2^n$) quantizer, (a divide by N quantizer; where N=$2^n$) embodying the invention can thus be used for "deserializing" a pulse stream of frequency f1 onto N output channels, the rate of the pulse stream on each channel being f1/N. Thus, in contrast to the prior art which includes a single junction quantizer with pulses having a rate of f1 produced on a single output line, systems embodying the invention include a divide by $2^n$ quantizer (i.e., divide by N; where N is equal to $2^n$). This enables up to N outputs to be outputted from the quantizer, with the frequency of the signals on each output line being f1/N.

A divide by N quantizer, where N is greater than 1, enables an increase in the dynamic range of the quantizer. The quantizer can be biased at a (voltage) level corresponding to (N)(fc)/2 to produce pulse streams having a rate of Nfc within the quantizer which can then be distributed on N output lines, with each output line carrying a pulse stream having a rate of fc.

BRIEF DESCRIPTION OF THE DRAWINGS

In the accompanying drawings like reference characters denote like components.

DETAILED DESCRIPTION OF THE INVENTION

Figure 2:
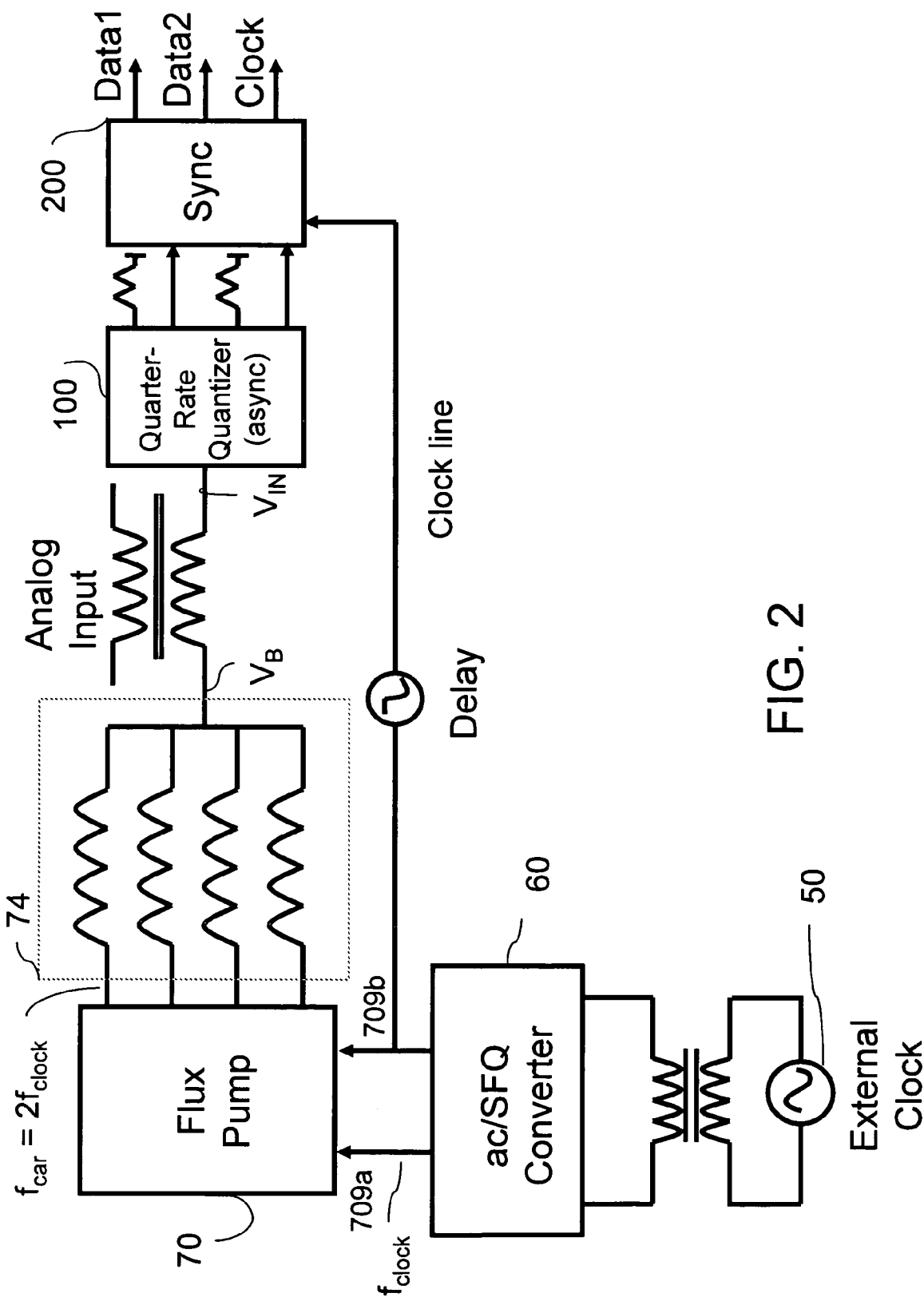
FIG. 2 is a block diagram of the front end of an ADC with a quarter-rate quantizer in accordance with the invention.

FIG. 2 is a block diagram of an ADC system embodying the invention. The system of FIG. 2 includes circuitry for performing the analog to digital conversion and circuitry for generating a bias (offset) voltage for the analog signal applied to the conversion circuit. The bias voltage generator includes an external clock circuit 50 coupled via an ac/SFQ converter circuit 60 to a flux pump 70 whose outputs are merged via an inductive network 74 to generate a bias voltage (VB) which is superimposed on the analog input signal to generate an analog input signal Vin which is applied to a quarter-rate (divide by four) quantizer 100. The quantizer 100 converts the amplitude of an analog voltage (Vin) into pulse streams which can be digitally processed via circuitry which can be synchronized to the basic clock circuit.

Figure 3:
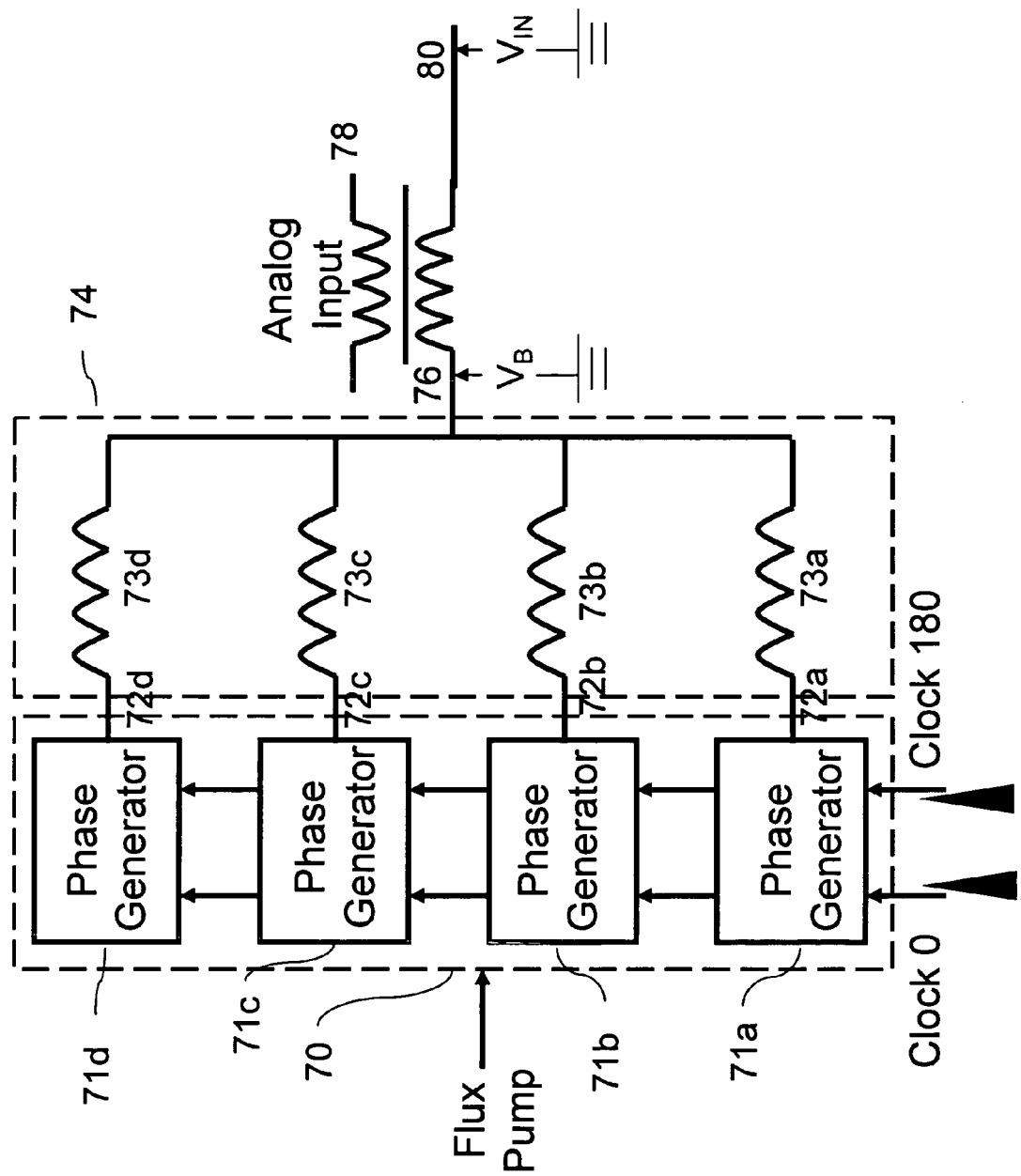
FIG. 3 is a block diagram of a flux pump and an inductive merging network suitable for use in practicing the invention.
Figure 3A:
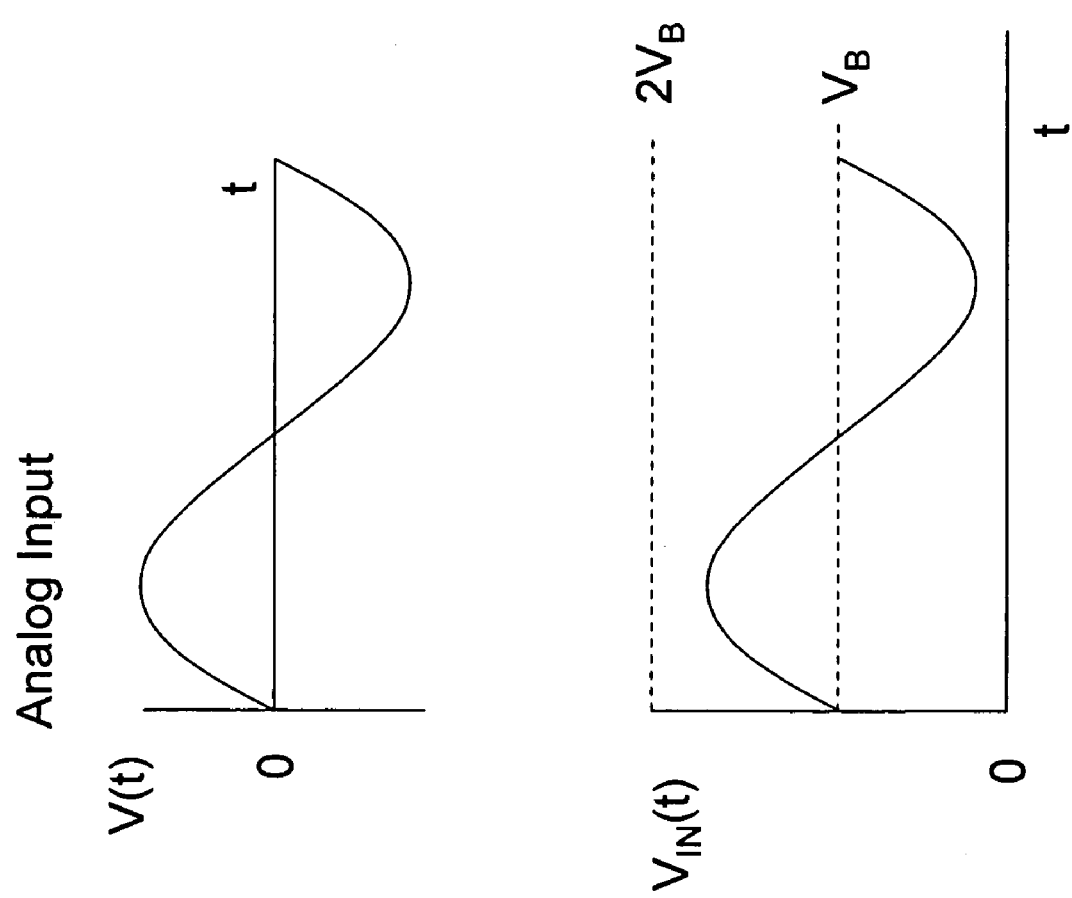
FIG. 3A is a diagram of waveforms associated with the circuit of FIG. 3.
Figures 3B, 3C:
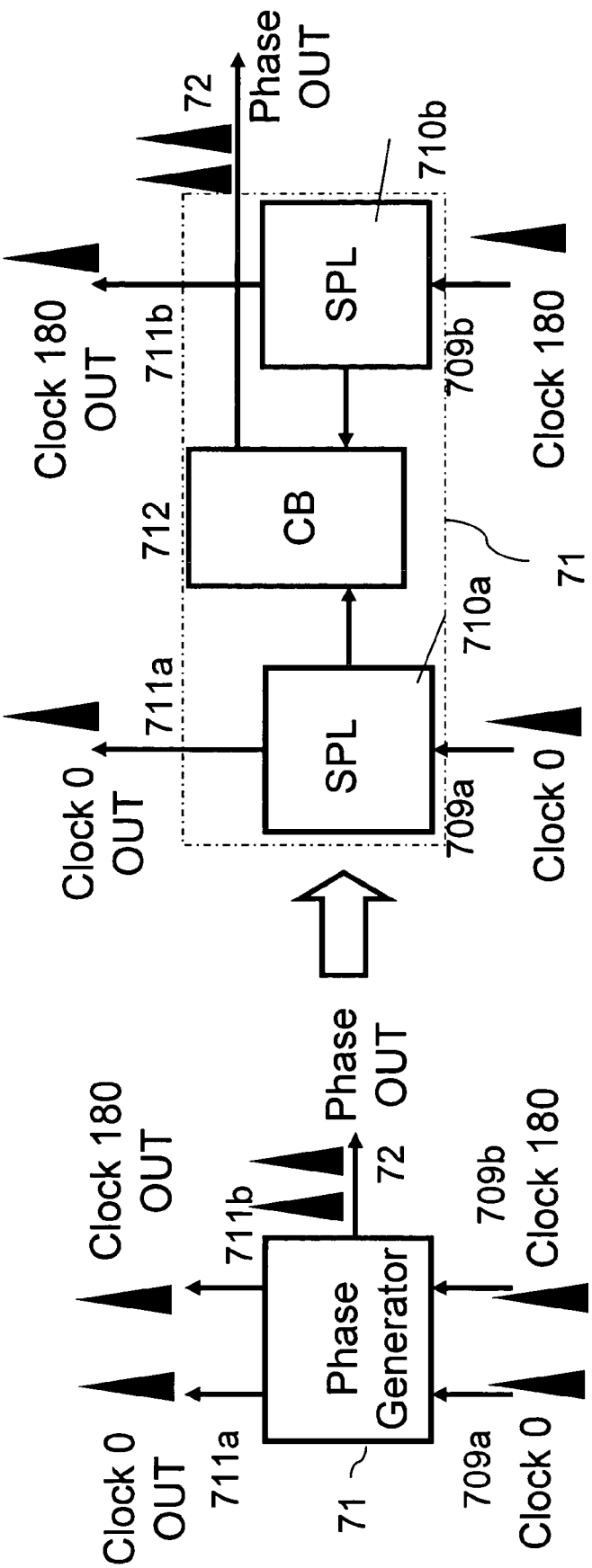
FIG. 3B is a block diagram of a phase generator circuit and FIG. 3C is a block diagram of circuitry forming a phase generator.

The bias generating circuitry shown in FIG. 2 may be implemented as shown in FIGS. 3, and 3A though 3D. In FIG. 3, the flux pump 70 is formed using four (4) phase generators (71a, 71b, 71c, 71d). As shown in FIGS. 3B and 3C each one of the 4 phase generators has two clock inputs (clock 0 and clock 180) and an output 72 at which is produced a combination of its two inputs, as shown in FIGS. 3B and 3C. The outputs (72i) of the 4 phase generators are fed to an inductive merger network 74 which functions to combine the phase generator outputs to produce the bias voltage (VB) shown in FIG. 3A. The amplitude of the bias voltage may be selected to have any suitable value. In one embodiment VB was selected to be 50 microvolts, while in another it was selected to be 80 microvolts. The actual value selected for VB will be a function of the amplitude of the analog input which can swing above and below zero, as shown in FIG. 3A. In addition, the value of VB may be selected to establish the steady state frequency of operation when no input signal is present and/or the maximum frequency at which it is desired to operate the quantizer 100, as further discussed below.

Each phase generator (see FIG. 3B) may be formed as shown in FIG. 3C, FIG. 3C shows that each phase generator may include two splitters (710a, 710b) and a confluence buffer (CB) 712. Each splitter has an input to which is applied a clock phase and two outputs at which are produced output signals corresponding to the signal applied to the splitter input. One output of each splitter (except for the last splitter) is fed to a subsequent splitter of the next phase generator and the other output is fed to the confluence buffer 712 of the instant phase generator. Thus, each confluence buffer 712 has a clock 0 input and a clock 180 input and produces at its output 72, which is also the output of the phase generator, two output pulses corresponding to the clock 0 and clock 180. Note that clock 0 and clock 180 are meant to represent an input clock signal having a certain phase and another clock signal which is 180 degrees out of phase therewith.

Figure 3D:
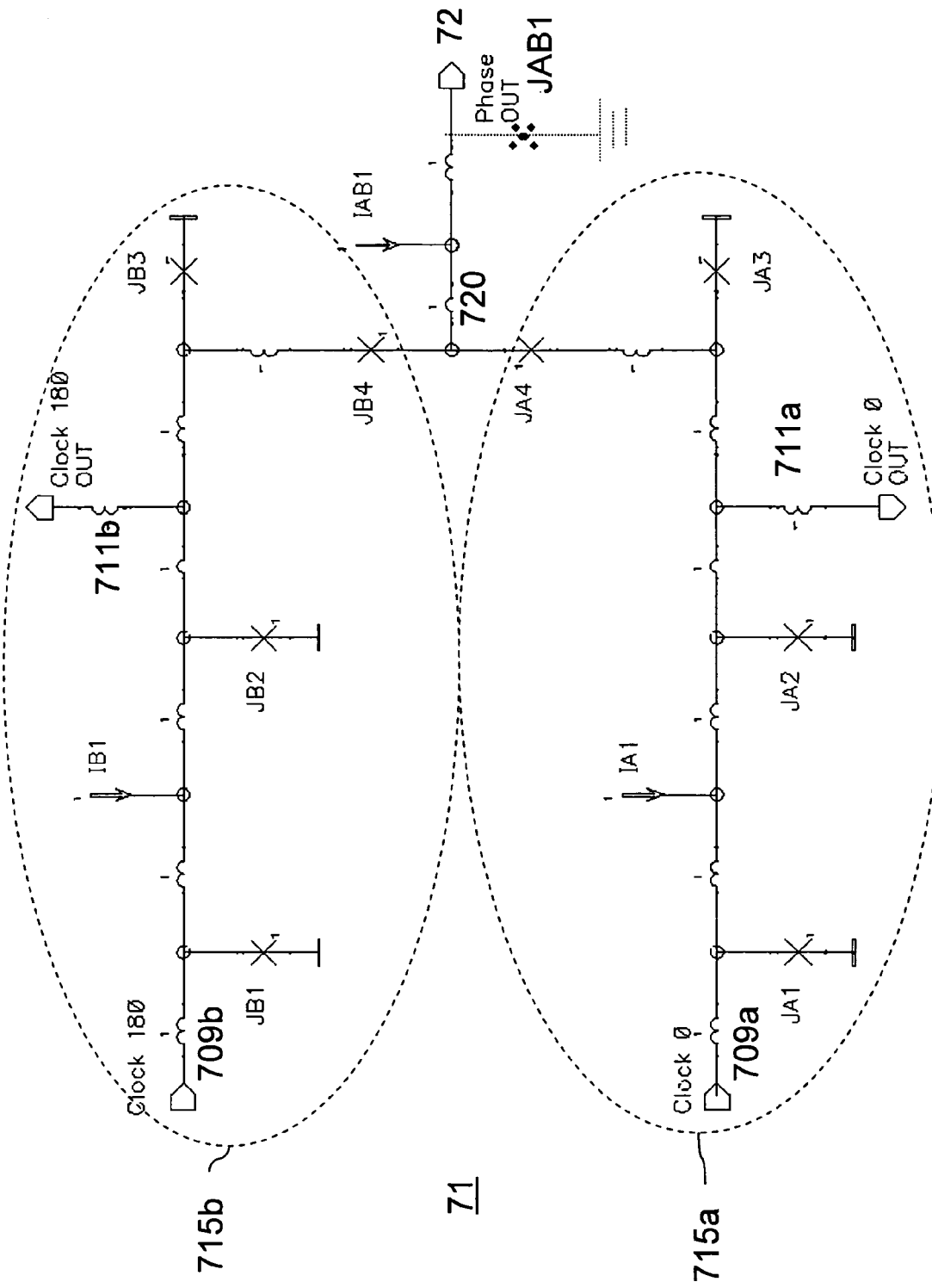
FIG. 3D is a schematic diagram of a phase generator circuit formed in accordance with the invention.

A circuit for implementing a phase generator 71 is shown schematically in FIG. 3D. The circuit includes two like branches 715a, 715b. Each branch has an input 709a, 709b at which is applied a clock 0 or a clock 180 signal. The clock 0 signal is reshaped and propagated along the branch 715a by junctions JA1 and JA2 and is then distributed to a clock 0 splitter output 711a. Concurrently, the clock 0 signal will be propagated to the combined buffer out put 72. Note JB4 functions to block the clock 0 signal from affecting branch 715b. The clock 180 signal is reshaped and propagated along the branch 715b by junctions JB1 and JB2 and is then distributed to a clock 180 splitter output 711b. Concurrently, the clock 180 signal will be propagated to the combined buffer out put 72. Note JA4 functions to block the clock 180 signal from affecting branch 715a. Consequently, a clock 0 and a clock 180 pulse appear at output 72 for each cycle of the clock. This produces an effective doubling of the input clock frequency at output 72. There is, intentionally, no Josephson junction (JJ) connected at output 72.

To illustrate the point a Josephson junction JAB1 is shown with dashed lines connected to the output of the circuit. Any, JJ connected to output 72 would have to switch at 2 times the clock frequency to maintain and reshape the pulses. Applicants recognized that JAB1 is not needed and that the high switching speed required of JAB1, which may be a limitation, can be avoided. The output junction (JAB1 shown in FIG. 3D) of the phase generator would act as a buffer and pulse shaper (and sharpener). Applicants recognized that JAB1 is unnecessary, since the phase generator is followed by an analog filter (inductive merger network 74) that broadens the pulses and eliminates the need for JAB1. Except for the removal of the JAB1 junction at the output of each phase generator, the splitters and confluence buffers may be implemented using standard RSFQ circuits, which duplicate and merge pulse streams. Each stage of the phase generator acts to merge the two input clock signals into a single combined pulse stream, as well as passing the two clocks to the next stage.

FIG. 3 shows that the bias voltage (VB) present at the merged output 76 is combined with the analog input 78 to produce Vin at terminal 80. Referring to FIG. 3A note that the analog input may be bipolar; i.e., it may be positive or negative relative to zero volts. By superimposing the bias voltage on the analog input, the voltage Vin is generated which is intended to be unipolar; i.e., it will generally be above zero volts, for anticipated or specified values of analog input.

In FIG. 3 the outputs of four (4) phase generator stages (71a-71d) are essentially connected in parallel to produce VB. Note that clock signals are supplied to the first stage (71a) and the clock outputs of phase generator 71a are fed to the inputs of phase generator 71b whose outputs are then fed to generator 71c whose outputs in turn feed phase generator 71d. The propagation of the clocks from one phase generator to the next may be deliberately staggered by ¼ period to generate a relatively smooth level at output 76. Combining the phase generator outputs in parallel effectively reduces the magnitude of the voltage pulse by a factor of 4, but combines them into a single staggered pulse train with the same average value. Together with the merging inductors (73a thru 73d) in section 74, this has the effect of generating a smoother bias voltage output.

The flux pump 70 thus functions to produce an average output bias or offset voltage (VB) which may be up to 4 times the value of the (prior art) single-junction quantizer. As a result of being able to provide a larger bias voltage, the flux pump 70 and integrating network 74 enable the quantizer 100 to function at a much higher frequency; (instead of reducing the effective clock frequency by 2, the two-phase clock (ac-sfq converter) enables multiplying the effective clock frequency by 2). The circuitry shown in FIGS. 3 through 3D may be used to generate a larger offset voltage (at output 76 and terminal 80), so that an analog input signal which varies significantly above and below zero can be tolerated without clipping, thus increasing the dynamic range of the ADC. As also discussed higher bias voltage causes the ADC in quantizer 100 to operate at a correspondingly higher frequency.

Figure 4:
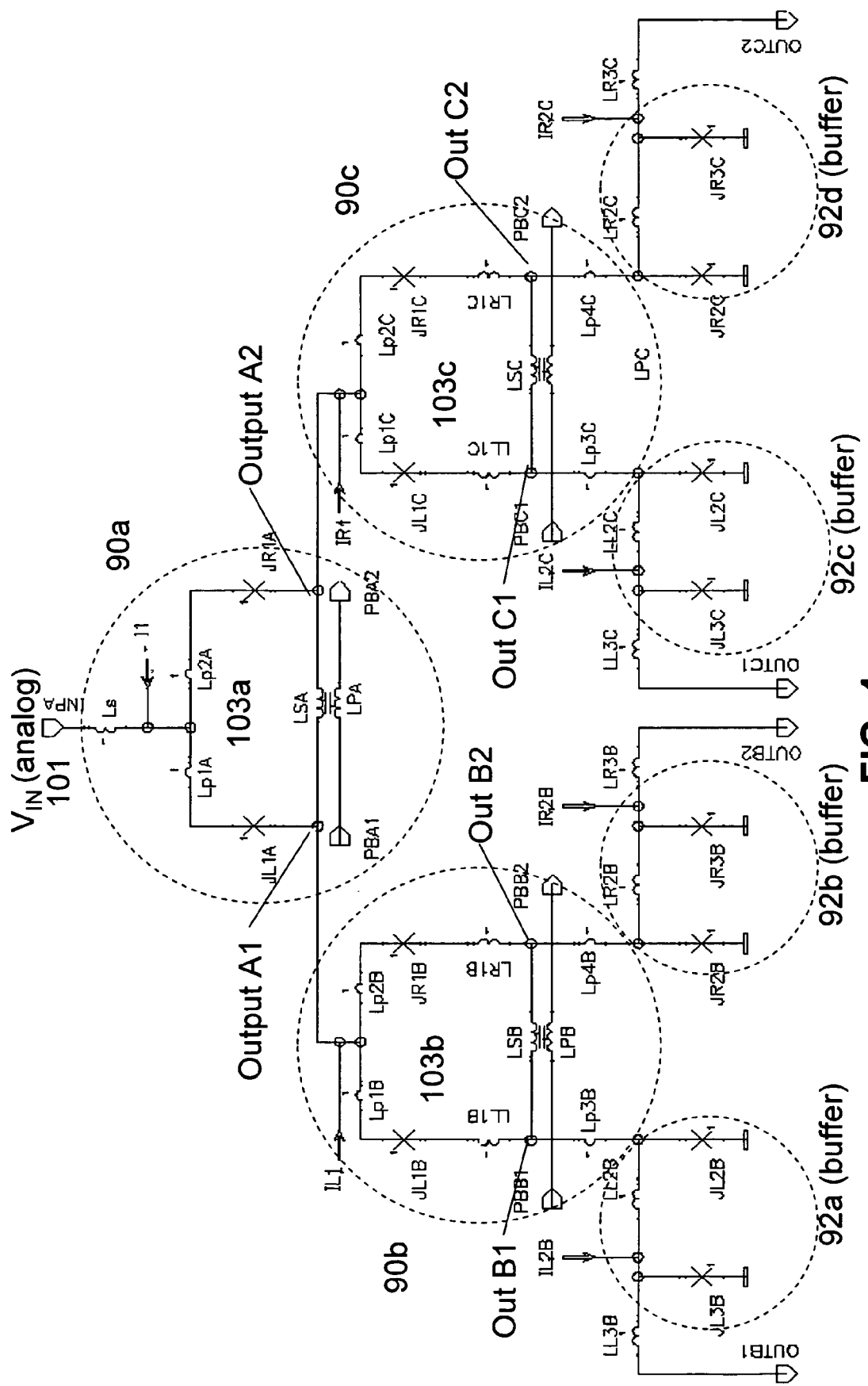
FIG. 4 is a schematic diagram of a novel ADC circuit (quantizer) embodying the invention.
Figure 5:
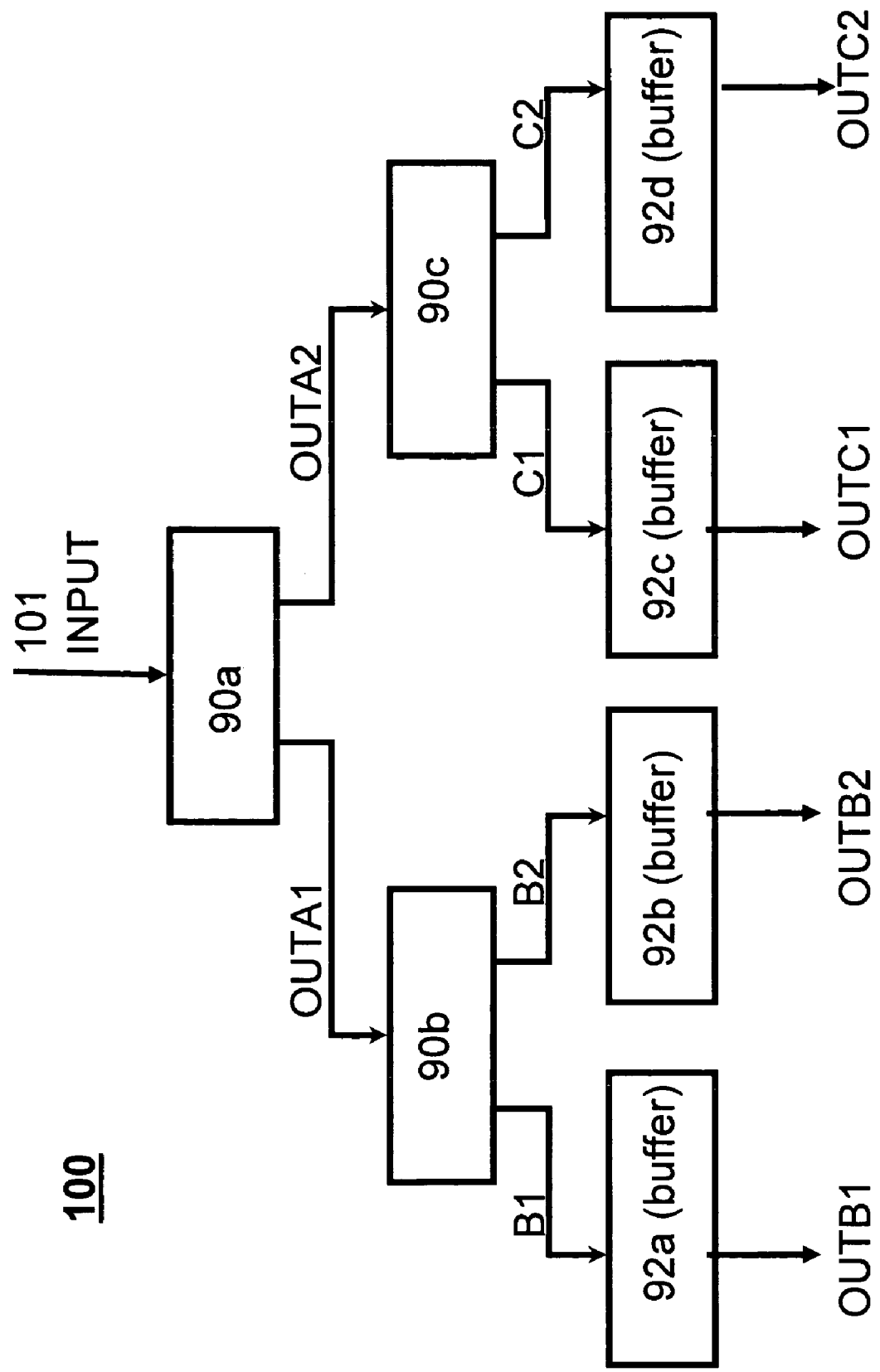
FIG. 5 is a block diagram of the circuit of FIG. 4.

A quantizer 100 containing an ADC embodying the invention is shown in greater detail in FIGS. 4 (schematic) and 5 (corresponding block). In FIGS. 4 and 5, there is shown an input network 90a having an input terminal 101 and two outputs A1 and A2. An analog input signal added to the bias voltage is applied to terminal 101. Network 90a functions to convert the amplitude of the analog input signal into digital signals (SFQ pulses) which are alternatively produced (distributed) at its two outputs (A1 and A2). The circuit 90a includes an input inductor Ls connected between terminal 101 and an input node 103a. A first branch comprised of a first inductor Lp1a in series with a first JJ, JL1A, is directly connected between input node 103a and output A1. A second branch comprised of a second inductor Lp2a in series with a second JJ, JR1A, is directly connected between input node 103a and output A2. Note that inductive elements Lp1a and Lp2a need not be discrete elements; they may respectively, represent, the parasitic and/or any discrete inductance of the wire connecting JL1A between node 103a and node A1 and JR1A between node 103a and node A2. A third branch connected between outputs A1 and A2 includes an inductive element LSA which functions to close the pulse forming superconducting loop comprising the three branches. The inductive element LSA is the secondary of a transformer, to whose primary, LPA, is supplied the required (dc) voltage/current (flux bias) to produce a desired bias current in the superconducting loop of network 90a. LSA functions to supply a bias current into the loop which causes the JJs (JR1A, and JL1A) in the first and second branches to switch alternatively, resulting in output pulses being produced alternatively at outputs A1 and A2.

Figure 8:
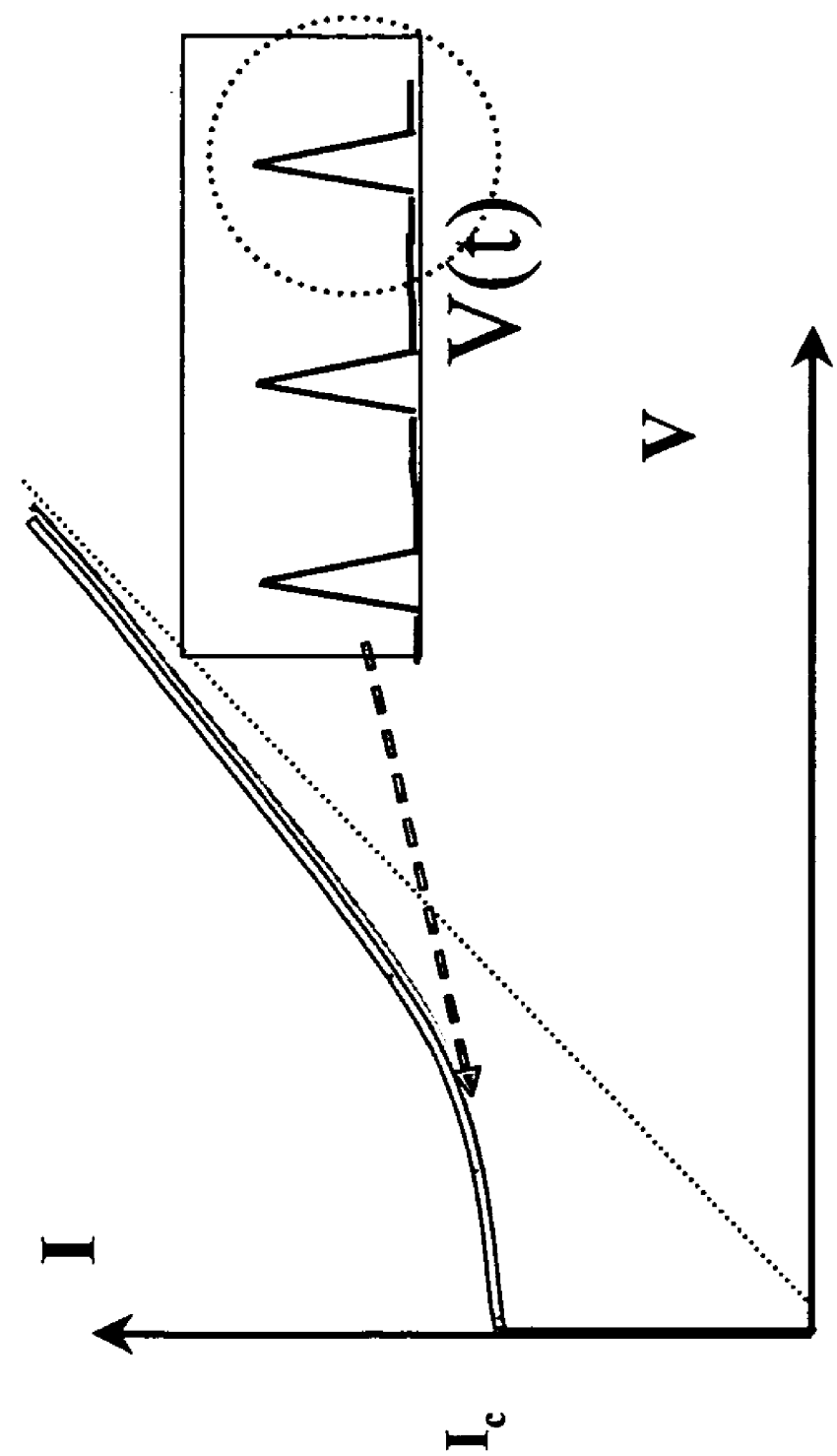
FIG. 8 is a diagram of the characteristics of a Josephson junction (JJ) suitable for practicing the invention.

To better explain the operation of the quantizer to follow, some of the characteristics of Josephson junctions (JJs) used to practice the invention should be noted. A JJ is a two-terminal circuit element that represents a weak connection between two superconductors. In the appended drawings, a JJ is identified by the symbol "X" in the circuit schematics. For currents less than the critical current, Ic, a JJ exhibits zero resistance. For currents larger than Ic, the detailed behavior of the JJ depends on the degree of damping present in and around the junction. For fast circuit applications, including those known as RSFQ (rapid-single-flux-quantum), JJs are usually damped. (In practice, a damped JJ typically consists of a superconducting tunnel junction shunted by a thin-film resistor.) The current-voltage (I-V) curve of a damped JJ is shown in FIG. 8. For a current (I) greater than Ic, the dc voltage rises sharply, eventually approaching the linear behavior of a normal resistor. But this dc voltage is really the time-average of a rapid dynamic process. As indicated in the inset of FIG. 8, the damped JJ generates a periodic train of voltage pulses, each single-flux-quantum (SFQ) pulse integrating to a magnetic flux quantum $\phi_0 = h/2e = 2$ mV-ps. For typical junctions the pulse width is a few picoseconds, and the amplitude (height) is close to 1 millivolt. So the average voltage $<V> = \phi_0 f$, where f is the frequency of the pulses. This can be used for an ideal linear analog-to-digital converter (ADC). It enables conversion from an analog voltage to a pulse stream period.

In RSFQ digital circuits, damped JJs are dc-biased below their critical current (typically whose frequency can be measured by counting pulses within a given clock around 75% of Ic; however for purpose of illustration and discussion bias to 50% of Ic is used), and, therefore, generate no SFQ pulses in the static case. However, a voltage (or voltage pulse) incident on a junction will temporarily causes the current to exceed Ic. If the incident pulse is fast, then the JJ will generate one, and only one, voltage pulse; it automatically resets back to the zero-voltage state. So this voltage pulse can be passed from one junction to another, and moved around and along an RSFQ circuit at high speeds. Furthermore, it is well known that a superconducting loop of inductance L can store magnetic flux, in units of $\phi_0$, associated with a lossless circulating current $I=\phi_0/L$. So an SFQ pulse can not only be transported, it can also be stored. Together, these provide the basis for a fast, low-power logic technology.

Network 90a functions such that when a voltage is applied to the input terminal 101 and node 103a, the current due to the applied analog voltage tends to divide equally between the first and second branches. However, assume that initially (due to LPA and LSA) a flux bias current (Ic/2) equal to ½ the critical current (Ic) is flowing clockwise within the loop. Thus, even though equal signal currents tend to flow through JR1A, and JL1A, JR1A is biased with Ic/2 flowing through it and it will switch from the superconductive state (V=0) to produce a SFQ pulse before JL1A (whose Ic has not been reached). When JR1A switches state, the bias current (and the corresponding flux in the loop) is then caused to reverse and flow in the opposite, (e.g., counterclockwise), direction in the loop and Ic/2 now flows through JL1A. Consequently, the input signal will then cause JL1A to switch next. After JL1A switches the bias current is again caused to flow in the clockwise direction. This alternate switching process is constantly repeated, with each one of JR1A and JL1A, switching alternatively. Consequently, while the loop generates SFQ pulses at a rate (e.g., f1) which is a function of the amplitude of the applied analog voltage at the input terminal, the first and second branches and the JJs in the first and second branches switch at one half that rate (i.e., at f½).

Therefore, It should be appreciated that input network 90a functions as a digitizer and as an ADC since it converts a variable (analog) signal into a stream of SFQ pulses whose frequency is a function of the amplitude of the signal. At the same time network 90a functions as a frequency divider, distributing the pulses produced within the loop alternatively at its two outputs. Thus the network functions to provide analog to digital conversion and frequency division at the same time.

The operation of the superconducting loop and flux bias in network 90a may also be explained as follows. For a superconducting loop with two JJs (JR1A and JL1A) to act as a frequency divider, the loop must permit two equivalent stable configurations, with circulating current in either of two directions (clockwise or counterclockwise). For example, consider the case where there are two junctions (e.g., JR1A and JL1A) each with the same critical current Ic, connected by an inductor L (e.g., LSA). The value of L is chosen so that $L*Ic=\phi_0$, where $\phi_0=h/2e=2$ mV-ps is the magnetic flux quantum. Assume also that L is the secondary coil of an input transformer, which is biased by an external current in the primary coil so that the flux in the loop is $\phi_0/2$.

Then the circulating current in the loop through the two JJs must be equal to Ic/2, in a direction determined by the sense of the current in the transformer. This circulating current is less than the critical current of both junctions, so that the junctions remain in the zero-voltage superconducting state, and the circulating current can be maintained without loss.

If now a positive voltage is applied to the input at the top of the loop, this will tend to send current equally in each of the two branches. This current will add to the circulating current in one branch and subtract from the current in the other branch. Assume that it adds to the left junction and subtracts from the right (counterclockwise current). Then the current will soon exceed Ic on the left. When this happens, the left junction generates an SFQ voltage pulse which it sends out the left output line. At the same time, this causes the magnetic flux in the loop to be reduced by one flux quantum or $\phi_0$, changing it from $(+)\phi_0/2$ to $(-)\phi_0/2$. This is equivalent to changing the sign of the circulating current in the loop to clockwise. As a result, the loop is configured so that the junction on the right is triggered to switch when a positive voltage is applied. After this happens, another SFQ voltage pulse is generated, this time out the right-hand output. This then causes the circulating current to switch back to the original configuration. Each time the input voltage generates an accumulated flux change in the loop (area under the voltage-time curve) of $\phi_0$, an output voltage pulse is generated, alternately out of either side of the frequency divider.

The external flux bias supplied to each frequency divider loop (through the transformer) is normally fixed during operation of the device. However, means (not shown) are provided to adjust it to enhance the performance of the device. For example, it may turn out that the junction or inductor parameters may be slightly different than those designed. This might cause the pulse output timing to be non-uniform, even in the case of zero input signal. This would tend to generate undesirable artifacts in the output spectrum of the ADC. The bias current to the flux bias control can be adjusted during initial device calibration to minimize such artifacts. Supplying this optimized bias value should maintain superior dynamic range and linearity of the ADC in all subsequent operations.

Figure 1:
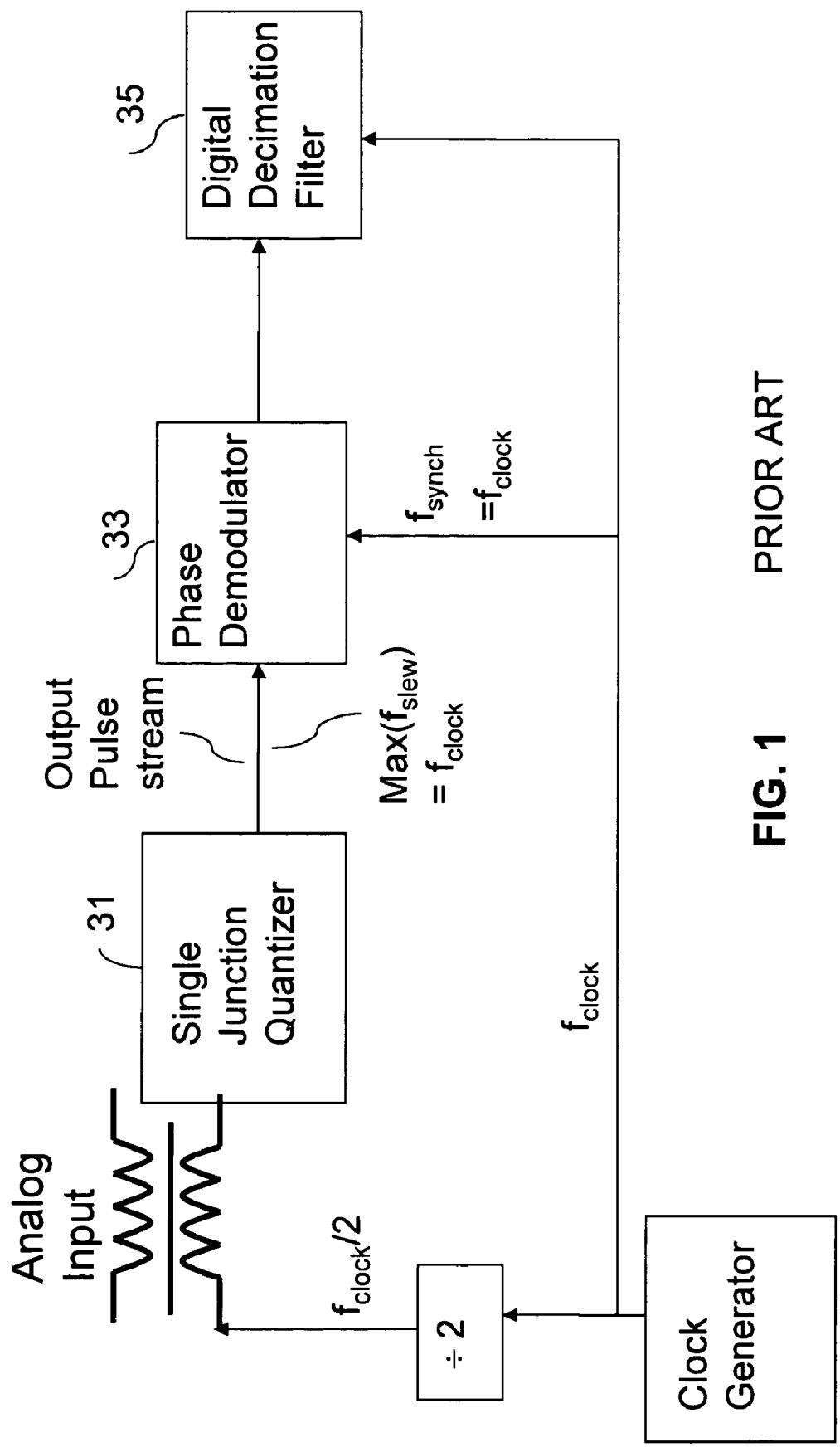
FIG. 1 is a simplified block diagram of the front end of a prior art ADC circuit.
Figure 1A:
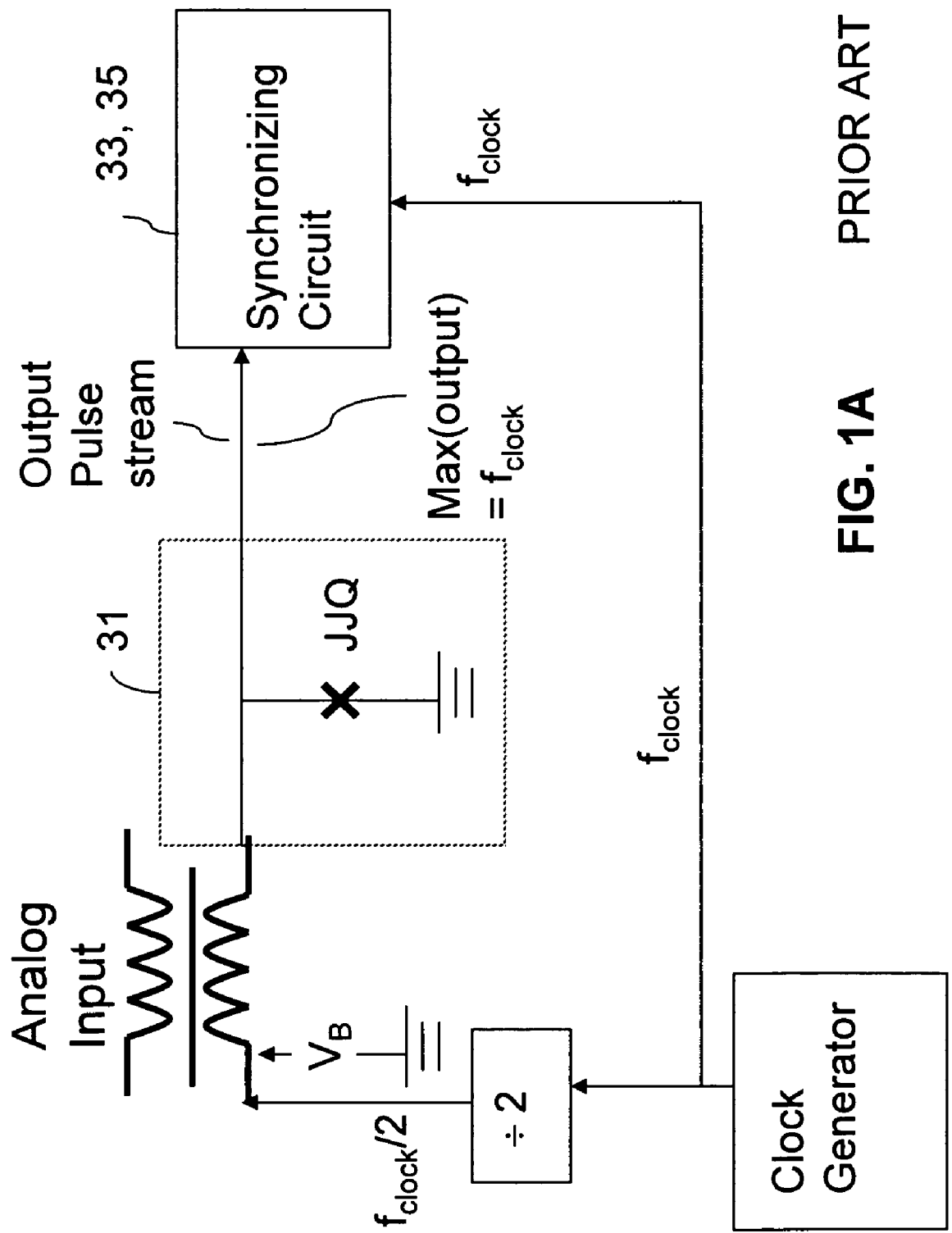
FIG. 1A is a schematic diagram of part of the circuit of FIG. 1.
Figure 7:
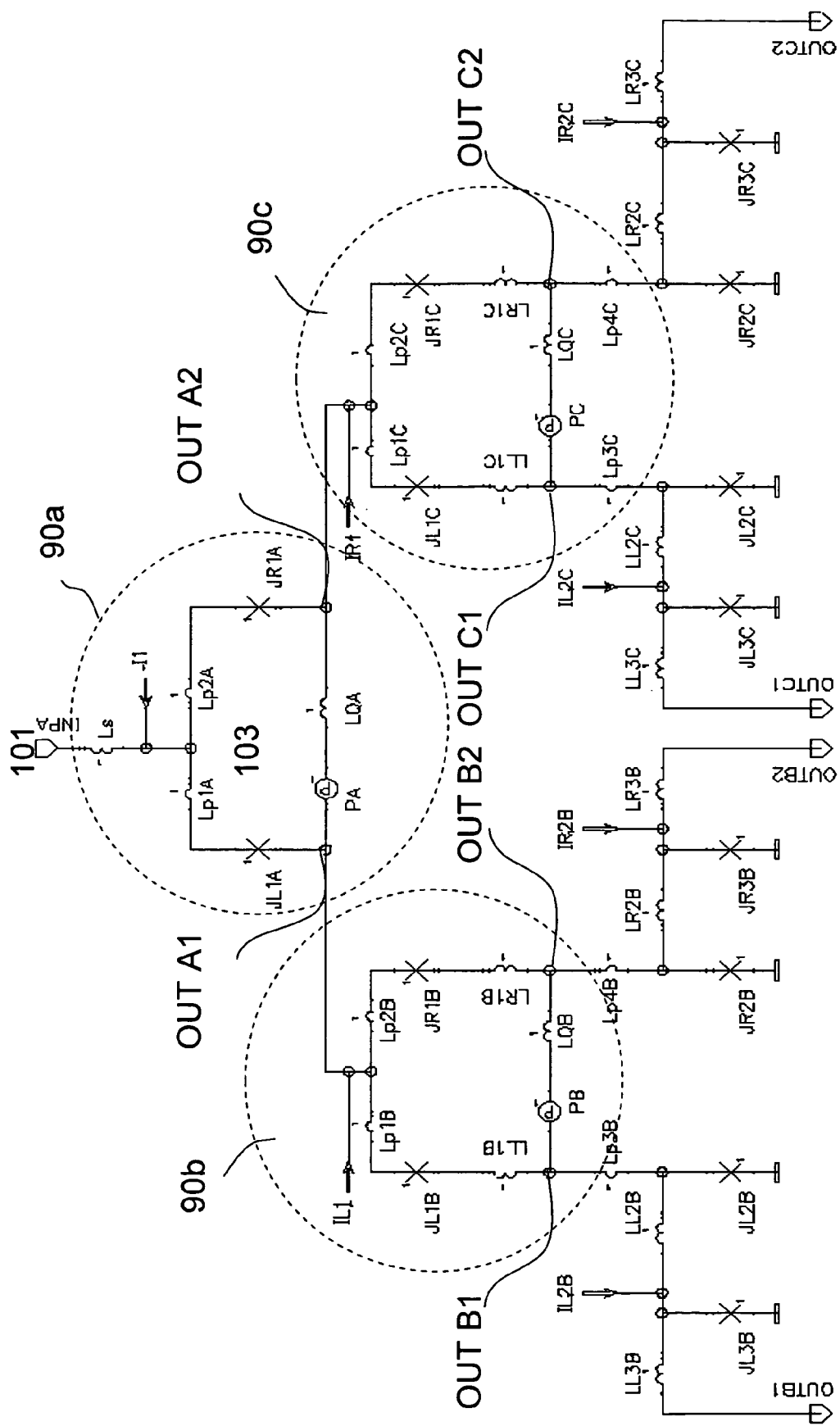
FIG. 7 is a schematic diagram of another ADC circuit embodying the invention.

Note that in FIGS. 4 and 7 there is shown (steady state) bias currents I1, IL1, IR1, IL2B, IR2B, IL2C, IR2C. These bias currents are superimposed on the circulating flux bias currents in their respective loops and function to predispose the JJ's to switch in only a particular direction corresponding to positive voltage pulses. Values of bias currents are selected to maximize the margins for proper operation of the circuits. In practice, such bias currents are generally implemented in the circuit layout using a bias voltage and a series bias resistor (or a tree of such bias resistors). When the signal current is zero, a bias current, Ib1, plus a flux bias current, Ifb, flows through one branch and Ib2 minus Ifb flows through the other branch. It may be assumed that Ib1=Ib2. It may also be assumed that the sum of [Ib+Ifb] is less than the critical current Ic of the JJ in either branch and that [Ib−Ifb]>0. As noted above, when a signal current, Is, flows such that Is+Ib+Ifb>Ic the JJ in the branch switches, producing an SFQ pulse at the corresponding branch output and Ifb reverses direction in the loop. The effect of the bias current is therefore limited to raising or lowering the trigger point of the JJ. It does not cause the frequency division due to the reversibility of the flux bias. Therefore, these (non-loop) bias currents have a limited effect on the signal processing and frequency division response of networks 90a, 90b, and 90c, These bias currents should therefore be distinguished from the flux bias which sets the circulating current in a loop, and the voltage bias which provides a pulse-rate offset to the quantizer. In contrast to the prior art, there is no JJ (e.g., JJQ in FIG. 1A) connected between the input and a reference point.

Therefore, a circuit embodying the invention may be characterized as comprising a network which includes a first branch containing a first JJ connected between a common input node and a first output node, a second branch containing a second JJ connected between the common input node and a second output node, and a third branch connected between the two output nodes for forming a closed loop and supplying a reversible flux bias current within the loop. These three branches and their components are the sole elements in the circuit, except for the bias currents, for processing the signals and providing frequency division. This is intended to exclude any JJ connected at the input terminal such as JJQ shown in prior art FIG. 1A.

The operation and features of network 90a (and of the ADC system of the invention) may be further illustrated by reference to the waveform diagram of FIG. 6. Referring to the Vin waveform it is assumed, for purpose of example only, that the bias voltage VB, applied to the input, is midway between VH and VL. This assumption follows the further assumption that the analog input signal which is to be converted to a digital format is bipolar; that is, the analog input can swing V1 volts above zero and V1 volts below zero. By adding a bias voltage VB=V1 to the analog signal and applying the combined voltage to the input terminal 101, the voltage at terminal 101 will be unipolar varying from some low value V1 to a high value VH, with VB being midway (as shown in FIG. 3A).

Figure 6:
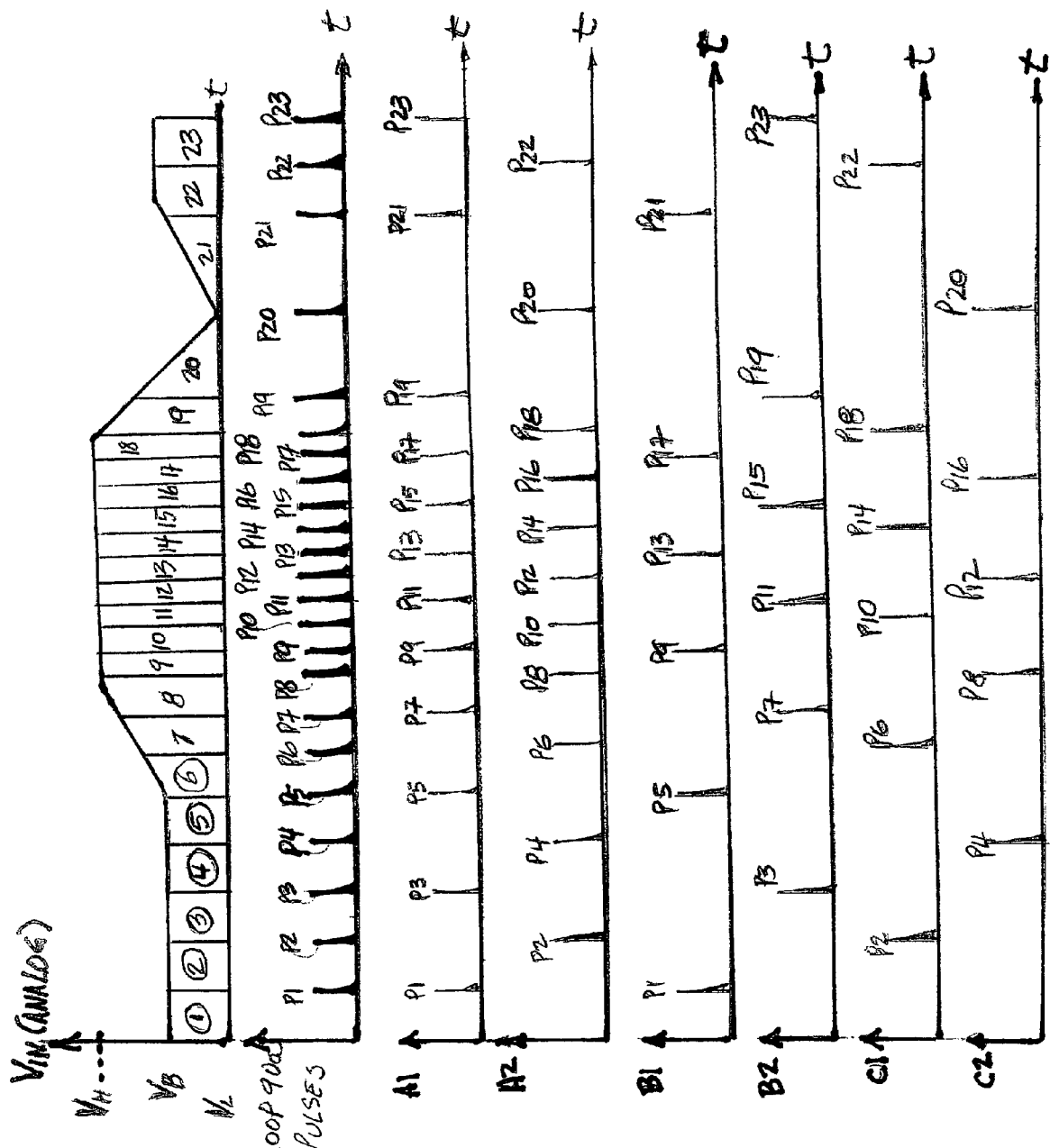
FIG. 6 is a waveform diagram of signals associated with the circuit of FIGS. 4 and 5.

FIG. 6 illustrates that the network 90a functions to produce SFQ pulses at a rate determined by the amplitude of the analog voltage present at the input terminal. When a given VB is applied to the circuit (in the absence of an analog input signal) pulses having a rate, or frequency, (fb), corresponding to VB, are produced as shown in FIG. 6 for period t1-t5. If an analog signal is applied and superimposed on VB such that the combination of VB and the analog signal is equal to 2VB, the pulses produced will have a frequency of 2fb. Where Vin is the addition of the VB and the bipolar analog signal, for values of Vin between VB and 2VB, the pulse rate will be between fb and 2fb. For values of Vin below VB, the pulse rate decreases proportionately. Thus, VB may be used to set or determine the pulse frequency of the system, when no signal is applied. Note that FIG. 6 is also intended to illustrate that there is an integration process with respect to the applied voltage and that SFQ pulses are produced when the product of the voltage and the time (the integral under the curve) exceeds a certain value causing the production of an SFQ pulse. Waveforms A1 and A2 illustrate, as explained above, that pulses are produced alternatively at outputs A1 and A2.

Returning to FIGS. 4 and 5, the outputs A1 and A2 are shown connected to the inputs of divide-by-two networks 90b and 90c. Networks 90b and 90c function as frequency dividers. The structure and operation of networks 90b and 90c are similar to those of network 90a. However, the inputs to networks 90b and 90c are, respectively, the pulses produced at outputs A1 and A2. Since the input signals to these networks are pulses there is no need to do analog to digital conversion in these stages. FIGS. 4, 5 and 6 illustrate that the pulse streams at A1 and A2, can be further divided down as shown (in FIG. 6) for waveforms B1, B2, C1 and C2 signals.

To ensure proper operation, buffer stages 92a, 92b, 92c, and 92d, are coupled between the outputs (B1, B2, C1, C2) of networks 90b and 90c and their respective outputs (outB1, outB2, outC1, outC2).

It is highly significant that the network 90a (as well as 90b and 90c) can convert an analog signal into a stream of SFQ pulses which are alternatively distributed between the two outputs of the circuit. It should also be appreciated that network 90a has been designed without any junction at its input. Accordingly, there is no component at the input limiting the speed at which the circuit can operate. The circuit can accommodate any specified voltage and produce SFQ pulses corresponding to the amplitude of the input voltage. Furthermore, the junctions within the first and second branches of the superconducting loop will need to switch at only one half the rate of the pulses being generated within the loop for the given amplitude of the applied voltage.

FIGS. 4 and 5 can thus be characterized as the diagrams of a divide by $2^n$ quantizer; where n is equal to 2, whereby the quantizer is a divide-by-4 quantizer. In FIG. 5 the circuit includes 3 divide-by-2 modules (90a, 90b, 90c). Each module has an input node 103a, 103b, 103c and two outputs (A1, A2; B1, B2, and C1, C2). The modules are so designed that input signals applied to their input node appear alternatively and cyclically at the outputs of the module. The modules may be stacked such that one output (A1) of module 90a is connected to the input of module 90b and the other output (A2) of module 90a is connected to the input of module 90c. The outputs B1, B2 of module 90b are applied to their respective buffers 92a, 92b and the outputs C1, C2 of module 90c are applied to their respective buffers 92c, 92d.

The quarter rate quantizer 100 functions as a 1:4 asynchronous demultiplexer (or deserializer) distributing a single input to four output channels in cyclical fashion. The demultiplexing is done asynchronously and the circuit is functionally similar to a tree of toggle flip-flops (TFFs) with complementary outputs. The quarter rate quantizer 100, shown in FIG. 4, has some significant advantages over a tree of toggle flip-flops. It is highly streamlined. For example, the quarter-rate quantizer can be constructed from 14 Josephson junctions integrated closely together, as opposed to 21 junctions required for a TFF tree. Furthermore, the quarter-rate quantizer is designed to operate faster (up to twice the speed, in principle) as compared to the TFF tree.

As for the case of networks 90b and 90c, it should be appreciated that pulses can be applied directly to the input of the network 90a in which case network 90a which includes junctions JL1A and JR1A acts as a 1:2 deserializer (or demultiplexer); distributing pulses arriving at its input alternately to its two outputs. As shown in FIGS. 4 and 5, each arm of this deserializer (network 90a) is further sub-divided into two arms (formed by networks 90b, 90c) which include junctions JL1B, JL2B and JR1B, JR2B to form a 1:4 deserializer.

In one embodiment of the invention the front end modulator (or quantizer) was made a divide-by-four (DB4) quantizer which was operated at an input frequency of 4 times the clock frequency of the following digital filter. A prototype circuit was laid out and fabricated in niobium superconducting technology, with the front-end modulator designed to operate at an effective data rate of 80 GHz, integrated with a digital filter operating at 20 GHz. This was based on a phase-modulation-demodulation ADC with a divide-by-4 quantizer that enables matching the two different frequencies. This improved ADC may result in a dynamic range that is enhanced by two bits (12 dB) from the prior-art ADC with a fixed sampling rate of 20 GHz. A circuit embodying the invention allows the modulator to use 4 times the number of channels in a multi-channel synchronizer compared to the present ADC, giving a potential 2-bit increase in the signal to noise ratio (SNR).

In general a quantizer embodying the invention can be a divide-by-N quantizer, where N is equal to $2^n$ and n can be any number equal to or greater than 1. The quantizer can accept a higher input frequency resulting in a system with a greater dynamic range. The higher frequency is then reduced by "deserializing" the phase modulated pulse stream onto multiple channels ($2^n$), such that the maximum frequency on a single channel is $2^n$ times lower than the input frequency.

For purpose of illustrating the benefits of the invention in comparison to the prior art, assume that the maximum rate of the pulse stream out of the quantizer applied to the synchronizing circuitry should not exceed the frequency (fc) of the clock (synchronizing) signal applied to the synchronization circuitry. The input of the superconducting quantizer is generally biased at the midpoint of the operating range of the quantizer. In accordance with the teachings of the prior art, for the single junction quantizer with a single output line, the maximum frequency of the pulse stream on the output line should be fc. This dictates that the input be biased (for the steady state condition) at a voltage level corresponding to fc/2 allowing the dynamic range of the input voltage to vary between 0 and a voltage condition corresponding to fc. At the same time, the JJ used in the quantizer must switch at the rate of fc.

By contrast, in ADCs embodying the invention there is included an analog to digital converter which can produce pulse streams having a maximum rate of f1 (where f1 may be equal to Nfc). The pulse stream is then applied to a divide by N frequency divider having N output lines so as to distribute the pulse stream such that the maximum rate of the pulses on each output line is equal to f1/N where f1/N is equal to fc; whereby f1 is equal to Nfc. The N output lines are coupled to the synchronizing circuitry operated at fc to process the digitized signals. The input of the converter can be biased (for the steady state condition) at a voltage level corresponding to Nfc/2 allowing the dynamic range of the input voltage to vary between 0 and a voltage condition corresponding to Nfc.

For a divide by 2 quantizer (including just loop 90a of FIG. 4), the input can be biased at a voltage corresponding to fc providing a dynamic range of 2fc and a maximum pulse stream rate of 2fc distributed by frequency divider action onto two output lines with the pulse stream on each line having a maximum rate of fc. At the same time, the JJ used in the quantizer would need to switch at a maximum rate of fc/2.

For the divide-by-4 quantizer of FIGS. 4 and 5, the maximum rate of the output pulses on the four (4) output lines applied to the synchronization circuit may be specified as fc. For this condition the maximum rate of the pulses within the input loop may be 4fc. The input loop may than be biased (for the steady state condition) at a voltage level corresponding to 2fc. As already noted, the dynamic range is then four times that for the single junction quantizer, with the junctions switching at fc.

The rate of the pulse streams on the N multiple output channels of the quantizer 100 will be equal to a maximum of Nfc divided by N; where $N=2^n$. With respect to the steady state bias condition the pulse rate on each output line will be equal to fc/2. These pulse positions may be considered to be either advanced or retarded in response to the analog input signal. Hence to accurately determine the change in pulse position, the phase demodulator or synchronizer must be clocked at least at the clock frequency, fc.

Since the outputs of the quantizer 100 rotate in a cyclical fashion, they are phase locked or in other words the signal is correlated. Hence, two out of the four channels may be sufficient to send the data to the synchronizer which is clocked at a frequency of fclock.

An asynchronous pulse train, which may be advanced or retarded by the analog input signal, is compared to a clocked synchronous pulse train. If an input pulse arrives between two clock pulses, then the output signal is a '1' (a pulse); otherwise the output is a '0' (no pulse). A large signal (compressed pulse train) will give mostly '1's, while a small signal (expanded pulse train) will give mostly '0's. This is consistent with generic oversampling single-bit ADCs, although the modulation and demodulation circuits are not always as clearly separated as they are here.

As already noted, the divide by 4 quantizer 100 of the invention has some significant advantages over the tree of toggle flip-flops (TFF). In the case of the toggle flip-flops the first junction JIN needs to switch at the input rate. In contrast, in the quarter-rate quantizer 100 the incoming fluxons are directly divided between junctions JL1A and JR1A and hence the fastest switching rate is one half (½) rate of the input. Also this is unlike the case for a TFF in which asymmetry between two arms is created using a current bias which may lead to unequal switching thresholds.

In circuits embodying the invention a phase bias (SLA IN FIG. 4, and PA in FIG. 7.) is used to create the asymmetry. This phase bias is implemented as an inductive coupling which can be externally tuned. For example, this could be done once during initial calibration, using a control current. That same control current should maintain this optimized performance in subsequent usage. Thus it is possible to bias one arm of the loop exactly to a pre-selected value (e.g., π or Ic/2) in order to make the switching threshold of each arm perfectly equal. Another advantage of quantizer 100 is that it can be treated as a single compact circuit with fourteen junctions against a tree of three toggle flip-flop with 21 junctions.

The invention has been illustrated with a divide-by-4 quantizer 100. However, it should be understood that each output can be further divide by a factor of two, to produce a divide by 8 with 8 output channels, or a divide by 16 with 16 output channels and/or any greater divider.

The present invention includes the design of a new front-end for ADC's with better performance characteristics like the effective number of bits (ENOB) or the signal to noise ratio (SNR) when compared to known superconducting ADCs.

It is possible to increase the resolution of an ADC by using a multi-channel synchronizer which effectively subdivides the clock period, measuring the pulse position more precisely in time. Functionally, this multi-channel synchronizer increases the number of quantization levels (m). The subsequent digital filter integrates the signal and averages it further, reducing the output bandwidth and increasing the effective number of bits.

FIG. 7 is a schematic diagram of a quantizer which illustrates that the flux bias sources for networks 90a, 90b, 90c may include a phase bias source (PA, PB, PC) in series with a corresponding inductive element (LQA, LQB, LQC) connected between the two outputs of each divider network. That is, each one of LPA/LSA, LPB/LSB, LPC/LSC shown in FIG. 4 may be replaced by an equivalent network which functions to provide the flux bias to the loop so that the loop functions as a divider distributing the pulses formed within the loop alternatively between the two outputs of the loop. The inductance LQA in loop 90a acts as a quantizing inductance. Assume that, initially, the junction JL1A is positively biased (and JR1A is negatively biased) by a phase source PA to provide a flux bias of $\phi_0/2$ within the loop. An incoming input signal [having a value corresponding to at least a fluxon ($\phi_0$)] adds to the bias and causes the positively biased junction JL1A to switch and prevents the input from traveling towards the bottom right divide by two circuit. The switching of JL1A induces a $2\pi$ leap which also changes the direction of circulating current in the quantizing inductance LQA, so that the junction JR1A is now positively while JL1A is negatively biased. In loop 90b, JR1B and JL1B are biased by a phase source PB. The switching of JL1A above triggers the switching in the bottom left (loop 90b) deserializer by switching the already biased junction JR1B (e.g., positive) and junction JL1B (e.g., negative) and thus producing an output pulse at outB1 or outB2, depending on the direction of the flux bias though LQB. After a pulse occurs, it also reverses the direction of circulating current in the quantizing inductance LQB, so that the junctions JL1B and JR1B are now biased in the opposite sense (e.g., JR1B-negative and JL1B-positive). Similarly, the next incoming fluxon (of $\phi_0$) now causes junctions JR1A to switch preventing the input from flowing towards the bottom left divide by two. The pulse is propagated to loop 90c. PC and LQC ensure that one of the two junctions (JL1C and JR1C) is positively biased and the other is negatively biased. The pulse from loop 90a causes the positively biased junction to switch and an output pulse to be produced at its output and also causes the flux bias in LQC to reverse direction and the biasing to the two junctions to reverse. The next incoming input fluxon ($\phi_0$) causes an output at one of the outputs of loop 90b (outB1 or outB2) and the subsequent incoming input causes an output at one of the outputs of loop 90c (outC1 or outC2). Thus, the circuit of FIG. 7 functions in a similar manner to the circuit of FIG. 4, responding to each incoming fluxon by delivering a fluxon at one of the four outputs in a cyclic fashion. The circuits of FIGS. 4 and 7 function to provide quantization and frequency division in response to an analog voltage applied to the input. It should however be noted that when pulses are applied to the circuit the circuit will then function as a divider distributing the pulses

What is claimed is:

1. A superconducting analog to digital converter (ADC) comprising:
   an input terminal for an application thereto of an analog input signal of varying amplitude;
   a first branch including a first Josephson junction (JJ) connected between said input terminal and a first output terminal;
   a second branch including a second Josephson junction (JJ) connected between said input terminal and a second output terminal; and
   flux bias means coupled between said first and second output terminals for forming a superconducting loop with said first and second branches; said flux bias means providing a bias current for said JJs wherein, in response to an analog voltage of varying amplitude applied at said input terminal, a stream of single flux quantum (SFQ) pulses is produced within the loop at a rate f1 which is proportional to the amplitude of the applied analog voltage and with the SFQ pulses being distributed alternatively at said first and second output terminals; wherein the superconducting loop functions as an analog to digital converter and as a frequency divider.

2. A superconducting ADC as claimed in claim 1, wherein the stream of SFQ pulses produced within the loop has a frequency f1, which is directly proportional to the amplitude of the applied analog voltage, and wherein the first and second JJs switch at a rate equal to f1/2 and the frequency of the signals at the first and second outputs is equal to f1/2.

3. A superconducting ADC as claimed in claim 1, further including first and second frequency divider circuits, each one of said frequency divider circuit having an input and two outputs; and wherein said first frequency divider circuit is connect to the first output terminal and the second frequency divider circuit is connected to the second output terminal, for distributing the pulses at said first and second output terminals cyclically at the outputs of said first and second frequency divider circuits.

4. A superconducting ADC as claimed in claim 3, wherein the outputs of said first and second divider circuits define four output lines, and wherein the frequency of the pulses on each output line is f1/4.

5. A superconducting ADC as claimed in claim 1 wherein said analog input signal is unipolar and wherein said ADC includes circuitry for supplying a bias voltage which is superimposed on a bipolar input signal for producing said analog input signal.

6. A superconducting ADC as claimed in claim 5 wherein the circuitry for supplying the bias voltage includes:
   a clock generator for producing clock signals at a frequency fc;
   a flux pump responsive to the clock signals for generating frequency signals having an effective rate of (k)(fc); where k is a number greater than 1;
   an inductive merging network coupled to said flux pump for converting said frequency signals into a quasi direct current bias voltage.

7. A superconducting ADC as claimed in claim 6 wherein the bias voltage is superimposed on the analog voltage to produce a combined voltage which tends to be unipolar and which is applied to said input terminal, wherein the frequency of the pulses in the superconducting loop is a function of the amplitude of the combined voltage.

8. A superconducting ADC as claimed in claim 6 wherein the flux pump includes N phase generators connected in a cascaded arrangement, each phase generator including first and second splitters and a pulse combining buffer.

9. A superconducting ADC as claimed in claim 8 wherein each phase generator includes first and second clock inputs for respectively applying thereto first and second input clock signals of different phase, a first output for producing thereat a clock signal corresponding to said first input clock signal; a second output for producing thereat a clock signal corresponding to said second input clock signal; and a combiner buffer output for producing thereat pulses corresponding to said first and second clock signals.

10. A superconducting ADC as claimed in claim 9, wherein a clock signal of frequency fc is applied to said first clock input, a clock signal of the same frequency but of different phase is applied to said second clock input, and wherein the pulses produced at the buffer output have a frequency of twice fc (i.e., 2fc); and wherein the buffer outputs are supplied to said inductive merging network.

11. A superconducting ADC as claimed in claim 4, wherein for a maximum specified value of an input analog voltage at said input terminal the maximum frequency of the pulses within the loop is f1max, and wherein the bias voltage is then specified to have a value corresponding to a frequency signal of f1max/2.

12. A superconducting analog to digital converter (ADC) comprising:
an input terminal;
means for applying an analog voltage of varying amplitude to said input terminal; and
a superconducting loop including two Josephson junctions (JJs) having an input node coupled to said input terminal and having first and second outputs; said superconducting loop being responsive to the amplitude of the analog voltage at said input terminal for producing a stream of single flux quantum (SFQ) pulses within the loop having a frequency of f1 and said JJs for alternately distributing the loop pulses to said first and second outputs at a frequency of f1/2.

13. A superconducting ADC as claimed in claim 12 further including first and second frequency dividing circuits; each one of said first and second frequency dividing circuits having an input and two outputs; and wherein the input node of said first frequency dividing circuit is connected to the first output of said superconducting loop and the input node of said second frequency dividing circuit is connected to the second output of said superconducting loop; each one of said frequency diving circuits producing a pulse stream at their respective outputs having a frequency of f1/4.

14. A superconducting ADC as claimed in claim 13 wherein said superconducting loop includes a first Josephson junction (JJ) coupled via an inductive means between said input terminal and said first output, a second Josephson junction (JJ) coupled via an inductive means between input terminal and said second output, and a flux bias means coupled between said first and second outputs.

15. A superconducting ADC as claimed in claim 14 further including a circuit for generating a bias voltage and means for superimposing said bias voltage on an analog input signal for producing a unipolar analog voltage applied to said input terminal.

16. A superconducting analog to digital converter (ADC) comprising:
a bipolar analog voltage to be converted to a digital format;
means for generating a bias voltage of sufficient amplitude and combining the bias voltage with said bipolar analog voltage for producing a combined analog input signal at an input terminal; the amplitude of the bias voltage being generated such that when it is superimposed on said bipolar analog voltage there is produced an analog input signal which tends to be unipolar;
a superconducting quantizer having an input connected to said input terminal for converting said analog input signal into a single flux quantum (SFQ) pulse stream having a frequency f1 which is directly proportional to the amplitude of the analog input signal; said superconducting quantizer having N outputs, wherein N is an integer equal to or greater than two, and including means for distributing the pulse stream in a cyclical and staggered fashion onto said N outputs such that the frequency of the pulses along each one of said N outputs is f1/N.

17. A superconducting ADC as claimed in claim 16, further including a synchronizing circuit adapted to receive selected ones of the N outputs of said superconducting quantizer for processing said pulse at a clock frequency of fc.

18. A superconducting ADC as claimed in claim 17, wherein the bias voltage applied to said input terminal corresponds to a pulse rate of Nfc/2.

19. A superconducting ADC as claimed in claim 18, wherein the frequency of the pulse streams at said N outputs is specified to have a maximum value such that f1/N is equal to fc.

20. A superconducting ADC as claimed in claim 18, wherein said superconducting quantizer includes a superconducting loop including two Josephson junctions (JJs) having an input node coupled to said input terminal and having first and second outputs; said superconducting loop being responsive to the amplitude of the analog voltage at said input terminal for producing a stream of single flux quantum (SFQ) pulses within the loop having a frequency of f1 and said JJs for alternately distributing the loop pulses to said first and second outputs at a frequency of f1/2.

21. A superconducting divider circuit comprising:
an input terminal for an application thereto of input signals;
a first branch including a first Josephson junction (JJ) connected between said input terminal and a first output terminal;
a second branch including a second Josephson junction (JJ) connected between said input terminal and a second output terminal; and
flux bias means coupled between said first and second output terminals for forming a superconducting loop with said first and second branches; wherein said flux bias means provides a reversible circulating loop bias current for said JJs wherein, in response to an input signal applied at said input terminal, SFQ pulses are produced within the loop, with the SFQ pulses being distributed alternatively at said first and second output terminals; wherein the circuit functions as a frequency divider.

22. A superconducting divider circuit as claimed in claim 21, wherein the flux bias means includes a superconducting transformer having a primary winding and a secondary winding, with the secondary winding being connected between said first and second output terminals; and wherein a bias source is connected across the primary winding to induce said bias current within the loop.

23. A superconducting divider circuit as claimed in claim 22, wherein components in said first and second branches and the flux bias means connected between said first and second output terminals are sole components processing the input signals and providing frequency division.

24. A superconducting divider circuit as claimed in claim 22, further including first and second frequency dividing modules, each module having an input and first and second outputs; means connecting the input of the first module to the first output terminal, and means connecting the input of the second module to the second output terminal, each module having a first branch including a first Josephson junction (JJ) connected between its respective input and its first output, a second branch including a second Josephson junction (JJ) connected between its input and its second output terminal, and flux bias means coupled between its first and second outputs for forming a superconducting loop with said first and second branches; said flux bias means providing a reversible circulating loop bias current for said JJs wherein, in response to an input signal applied at said input, SFQ pulses are produced within the loop, with the SFQ pulses being distributed alternatively at said first and second output; whereby each module functions as a frequency divider.

25. A superconducting divider circuit as claimed in claim 24, wherein for each one of said first and second modules the components in their first and second branches and their flux bias means connected between their first and second outputs are sole components for processing their respective input signals and providing frequency division.

* * * * *